(12) United States Patent
Arreola

(10) Patent No.: US 9,055,693 B2
(45) Date of Patent: Jun. 9, 2015

(54) REVERSIBLE FAN MODULE FOR ELECTRONIC CIRCUIT ASSEMBLIES

(71) Applicant: Virtual Instruments Corporation, San Jose, CA (US)

(72) Inventor: Luis Arreola, San Jose, CA (US)

(73) Assignee: Virtual Instruments Corporation, San Jose, CA (US)

( * ) Notice: Subject to any disclaimer, the term of this patent is extended or adjusted under 35 U.S.C. 154(b) by 213 days.

(21) Appl. No.: 13/756,094

(22) Filed: Jan. 31, 2013

(65) Prior Publication Data

US 2014/0211418 A1 Jul. 31, 2014

(51) Int. Cl.
*H05K 7/20* (2006.01)

(52) U.S. Cl.
CPC .................... *H05K 7/20172* (2013.01)

(58) Field of Classification Search
USPC ........ 361/676–678, 679.46–679.54, 361/688–722, 752, 760, 831
See application file for complete search history.

(56) References Cited

U.S. PATENT DOCUMENTS

| | | | | |
|---|---|---|---|---|
| 7,344,358 B2* | 3/2008 | Lu et al. | | 415/211.2 |
| 7,352,574 B2* | 4/2008 | Chen | | 361/695 |
| 7,515,413 B1* | 4/2009 | Curtis | | 361/695 |
| 7,535,709 B2* | 5/2009 | Fan et al. | | 361/695 |
| 7,537,480 B2* | 5/2009 | Li | | 439/485 |
| 7,699,582 B2* | 4/2010 | Tao | | 415/213.1 |
| 7,699,692 B2* | 4/2010 | Yin | | 454/184 |
| 7,845,903 B2* | 12/2010 | Li | | 415/186 |
| 8,784,167 B2* | 7/2014 | Yi | | 454/184 |

* cited by examiner

*Primary Examiner* — Courtney Smith
(74) *Attorney, Agent, or Firm* — Fenwick & West LLP

(57) ABSTRACT

An electronic enclosure includes a chassis with a fan base and a fan module. The fan base and fan module are disposed so that the fan module may installed in the fan base in a first configuration to provide front-to-rear air flow within the enclosure, or the fan module may be detached from the fan base, turned and reinserted into the fan base in a second configuration to provide rear-to-front air flow within the enclosure. The fan base is provided with two power connectors, one of which mates with the fan module in the first configuration and the second one of which mates with the fan module in the second configuration.

6 Claims, 4 Drawing Sheets

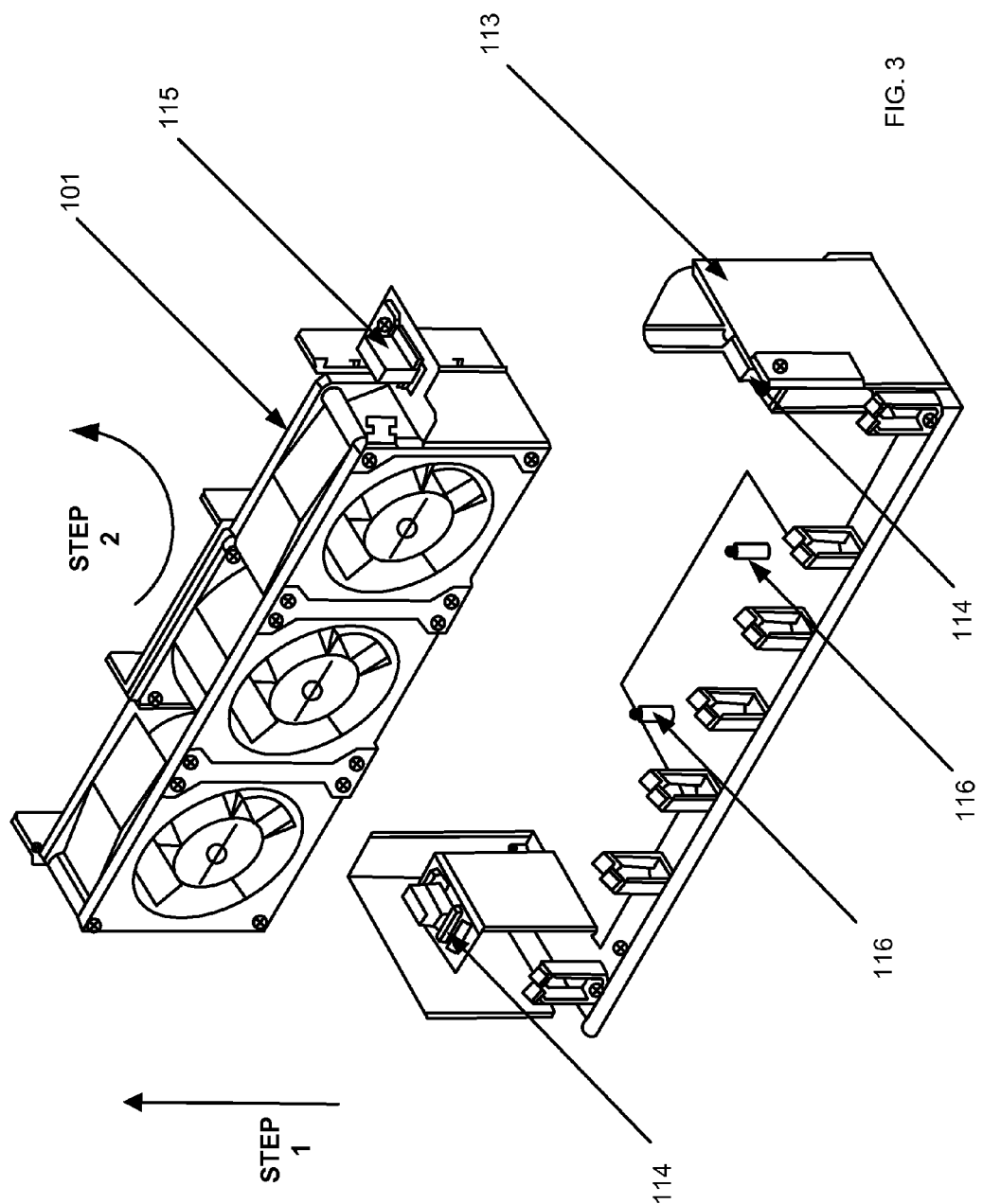

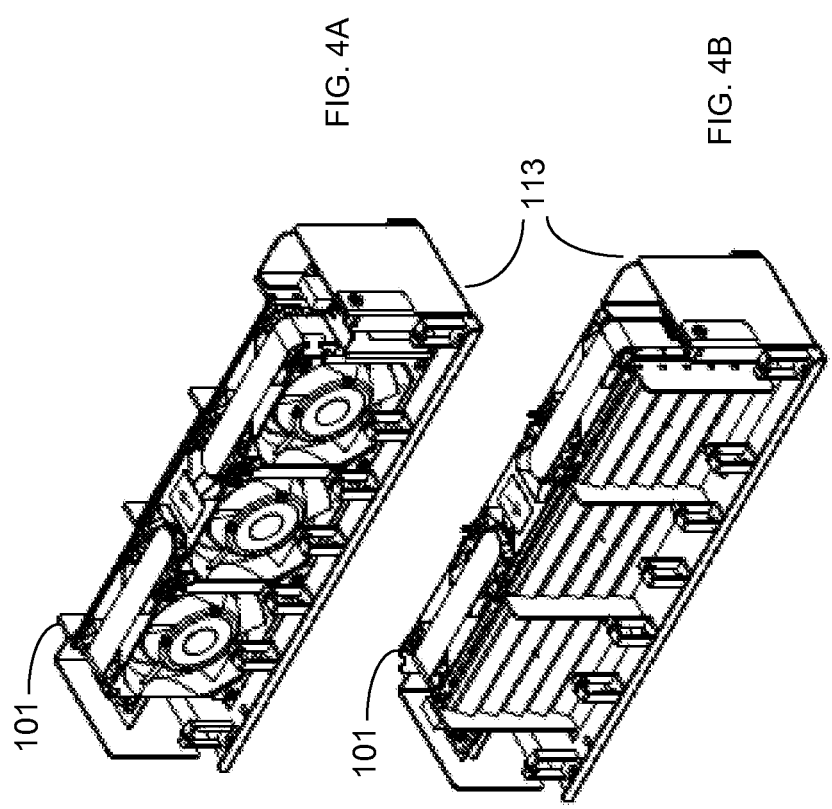

US 9,055,693 B2

REVERSIBLE FAN MODULE FOR ELECTRONIC CIRCUIT ASSEMBLIES

FIELD OF THE INVENTION

This invention is related to air flow devices for electronic circuits and particularly to reversible fan modules for cooling electronic equipment.

BACKGROUND OF THE INVENTION

There are a number of problems inherent in housing electronic circuits. One major problem is providing adequate thermal management for the electronic circuits. Electronic circuits generate heat during use and must be properly cooled in order to continue to function properly. Various conventional systems addressing the need for cooling exist, including inducing an air flow (forced convection), natural convection and radiation. Other alternatives include circulating liquid, to carry thermal energy from heat exchangers coupled to the heat source to external radiators or coolers.

Conventional systems that operate by inducing an air flow typically utilize fans or blowers to move air directly over the circuitry requiring cooling. In a system having multiple electronics enclosures, such as a rack-shelf system, there may be multiple fans/blowers, e.g., one or more per enclosure, which induce air flow across their own associated circuit boards. Alternatively, there might be one large fan for the entire rack-shelf system, inducing air flow across all circuit boards simultaneously.

Such conventional cooling systems need to address a number of challenges. One problem addressed by the disclosure herein is that the most appropriate cooling approach for a certain electronic chassis may be dependent upon the installation details of the unit. Some equipment rooms may be optimized for front-to-rear ("FTR") ventilation while others may be optimized for rear-to-front ("RTF") ventilation. In some conventional solutions, two fan modules are available, one optimized for FTR and the other for RTF, and the appropriate one is selected at the time of installation.

In some applications, merely reversing the electrical feed to the fan may reverse operation of the fan and therefore the ventilation direction. However, for fans powered by alternating current this option is not available, and even for direct current fans many aspects of fan design, including blade geometry, filter and louver designs, and the like, are optimized for a particular direction of flow. Therefore, merely reversing the rotational direction of a fan itself is often not an optimal solution.

What is needed is a simple and inexpensive manner to address the fact that the most appropriate manner of ventilation of an electronics enclosure may depend on the environment in which it is installed.

SUMMARY OF THE INVENTION

In one embodiment, an electronic circuitry enclosure comprises a fan module and a base, the base configured to receive the fan module in a first orientation for operation in a first mode and in a second orientation for operation in a second mode. In one aspect, the base includes a first connector and a second connector and is configured to provide power to the fan module via the first connector in the first orientation and via the second connector in the second orientation. In another aspect, the fan module includes a first connector and a second connector and is configured to receive power from the base via the first connector in the first orientation and via the second connector in the second orientation.

Additionally, in some aspects the base includes alignment features configured to ensure proper seating of the fan module in either the first orientation or the second orientation.

The features and advantages described in the specification are not all inclusive, and particularly, many additional features and advantages will be apparent to one of ordinary skill in the art in view of the drawings, specification and claims herein. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 3 is an exploded view of the fan module and its corresponding base.

FIG. 4A illustrates the fan module installed in the base in an FTR configuration, and FIG. 4B illustrates the fan module installed in the base in an RTF configuration.

DETAILED DESCRIPTION

A preferred embodiment is now described with reference to the figures where like reference numbers indicate identical or functionally similar elements.

Figure 1:
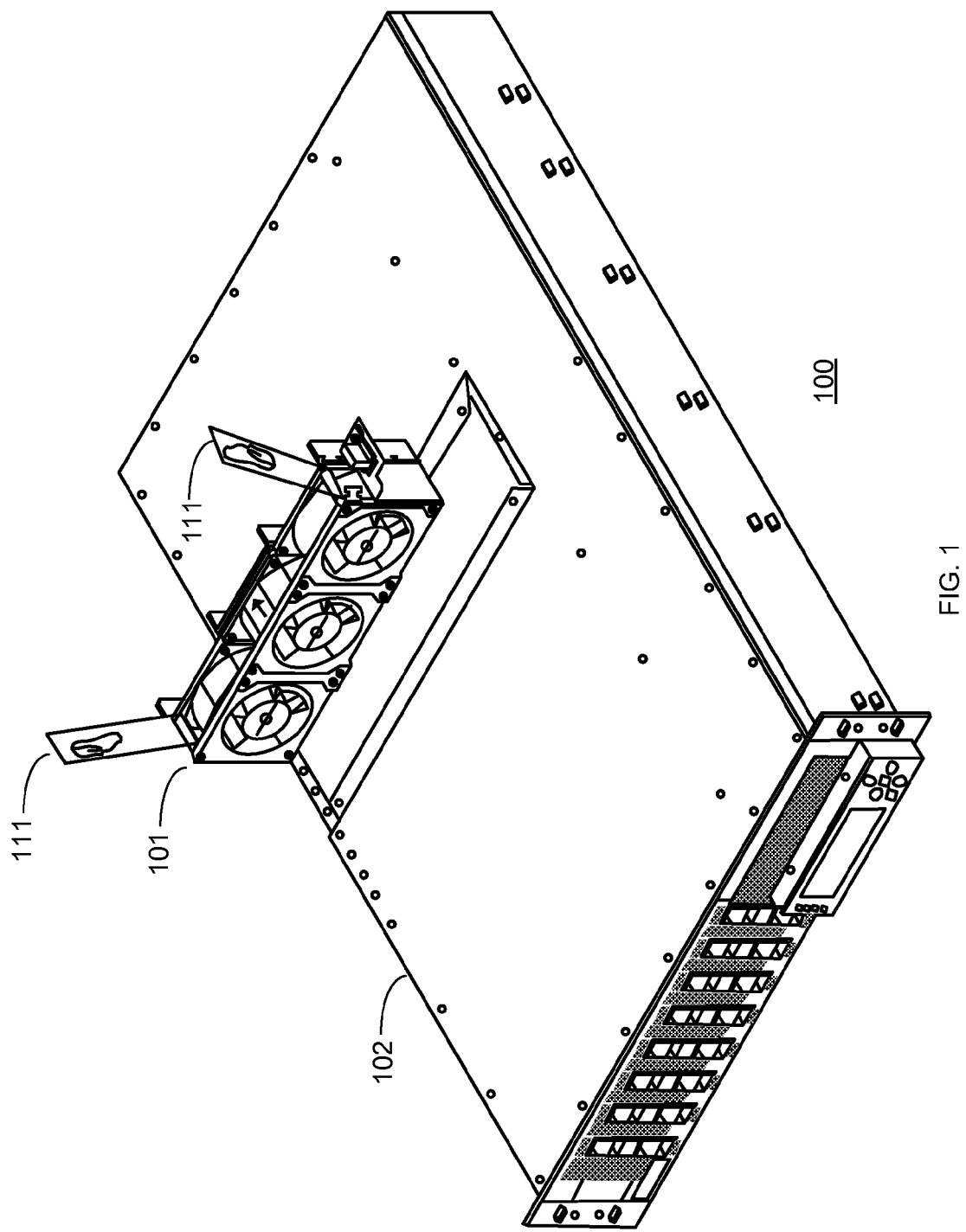
FIG. 1 is an illustration of an electronic circuit enclosure according to one embodiment.

FIG. 1 is a perspective view of an electronics enclosure 100. The enclosure 100 includes a chassis 102 into which a fan module 101 is installed. In one embodiment, the fan module 101 has pull tabs 111 to facilitate removal of the fan module 101 from chassis 102.

Figure 2:
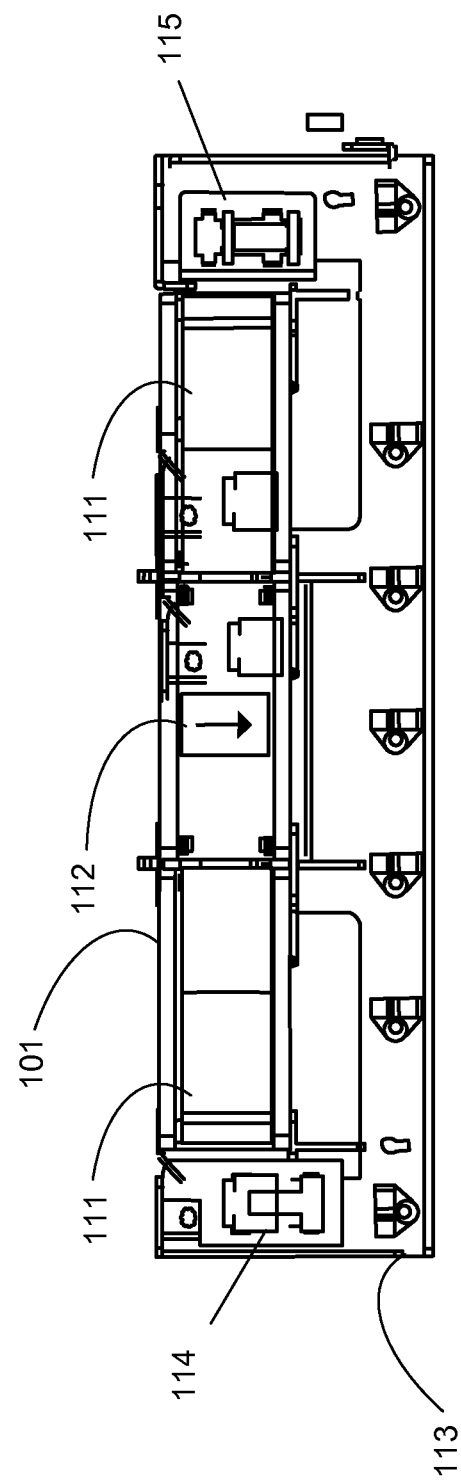
FIG. 2 is a top view of a fan module, according to the embodiment of FIG. 1.

Referring now to FIG. 2, fan module 101 is shown in top view in connection with base 113. In one embodiment, base 113 is fixed with other electronic circuitry of, or otherwise integrated with, chassis 101. As mentioned above, fan module 101 includes pull tabs 111 to facilitate removal of fan module 101 from base 113. A directional arrow label 112 shows the airflow corresponding with the fan module (here, RTF, assuming the front of enclosure 100 is toward the bottom of the figure as illustrated in FIG. 1).

In one embodiment, base 113 is implemented using a sheet metal tray, fitted with electrical connector(s) and guide pins, with corresponding features (mating electrical connector(s) and alignment holes matching the guide pins) being provided on fan module 101. In the embodiment shown, fan module 101 includes three fan units, but in other embodiments modules with more or fewer fan units could be used. In a typical embodiment, conventional 80 mm fans are used; in other embodiments conventional 40 mm fans are used. Those skilled in the art will recognize that selection of fan groupings and sizes is made both based on physical limitations (e.g., height of chassis 102) and thermal management requirements based on the nature of the electronics in enclosure 100. In some instances, fan module 101 can readily be replaced by another module of different size, speed, blade pitch, etc. as needed for the circuitry in enclosure 100. Those skilled in the art will also recognize that various other types of alignment features, by way of non-limiting example tabs, notches, rails, and the like, can similarly be used to ensure correct insertion of fan module 101 into base 113.

In the embodiment illustrated in FIG. 2, fan module 101 also includes a male power connector 115 configured to mate with an appropriate one of two corresponding female power connectors on fan base 113, one visible (114) and one not shown underneath male power connector 115. These power connectors are configured so that fan module 101 receives power regardless of whether it is installed in base 113 for RTF or for FTR flow. In such an embodiment, only one of the female power connectors on fan base 113 is used, depending on which way fan module 101 is installed. In some embodiments fan module 101 includes only one connector but base 113 has two connectors as just discussed; in other embodiments fan module 101 includes two connectors while base 113 has only one. In a further embodiment, a single electrical connection is provided on each end of fan module 101, and a single electrical connection is likewise provided on each end of base 113; in this embodiment all of the connectors are used regardless of whether the fan module 101 is installed for FTR or RTF operation.

Referring now to FIG. 3, there is shown a perspective view of fan module 101 as it is being removed for reinstallation, with opposite airflow, in base 113. As illustrated, a first step in such reconfigured installation is removal of fan module 101 from base 113 but pulling it upward (shown as "Step 1"). Next the fan module 101 is turned 180 degrees (denoted as "Step 2"), finally, not shown, the fan module 101 is reinstalled by pushing it to mate with base 113. In the embodiment shown, not only do connectors 114, 115 assist in ensuring good mechanical alignment (as well as electrical connection) between fan module 101 and base 113, but guide pins 116 are also provided on base 113 to ensure accurate seating of fan module 101 in base 113. In many environments a sheet metal cover (not shown on FIG. 1) may be installed over fan module 101 to better seal enclosure 100 for improved airflow, dust avoidance, and the like. In other embodiments, fan module 101 itself has a top portion that is sufficiently close in dimension to the opening into which it fits that such sheet metal cover is not required to achieve a reasonable seal.

Referring now to FIG. 4A and FIG. 4B, fan module 101 can readily be installed in base 113 in an FTR configuration (FIG. 4A) or in an RTF configuration (FIG. 4B).

It is appreciated that the particular embodiment depicted in the figures represents but one choice of implementation. For example, in some installations side-to-side airflow, i.e., left-to-right (LTR) and right-to-left (RTL), in addition to FTR/RTF airflow may be an option, so a 90-degree turn of fan module 101 in addition to the 180-degree turn disclosed in detail here is provided in other embodiments. In still other embodiments, only side-to-side airflow may be envisioned, with a 180 degree turn of fan module 101 to change between LTR and RTL. Other choices would be clear and equally feasible to those of skill in the art.

While the invention has been particularly shown and described with reference to a preferred embodiment and various alternate embodiments, it will be understood by persons skilled in the relevant art that various changes in form and details can be made therein without departing from the spirit and scope of the invention.

It should be noted that although the discussion herein has centered on air flow in electronic enclosures, those skilled in the art will readily recognize that these techniques can be used to facilitate other possible thermal management challenges. For instance, a liquid cooling flow may be changed in similar manners. Through use of the systems and methods disclosed herein, various improvements in thermal management for electronic, electrical, mechanical, and other devices (herein referred to generally as "electronic circuit assemblies") can readily be accomplished using fans, blowers, turbines, pumps or other devices for movement of a thermal management medium (such devices being herein referred to generally as "fan modules").

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for an electronics enclosure with a reversible fan module through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An electronic circuit enclosure, comprising:
   a chassis;
   a fan base integrated with the chassis, the fan base comprising two base connectors; and
   a fan module comprising a module connector, the fan module disposed to mate the module connector with a first one of the two base connectors in a first configuration to provide a first mode of operation and further disposed to mate the module connector with a second one of the two base connectors in a second configuration to provide a second mode of operation.

2. The enclosure of claim 1, wherein the fan base includes alignment features disposed to facilitate placement of the fan module in the first configuration and in the second configuration.

3. The enclosure of claim 1, wherein the fan base and the fan module are disposed to facilitate change from the first configuration to the second configuration by pulling the fan module apart from the fan base, turning the fan module with respect to the fan base, and then inserting the fan module into the fan base.

4. An electronic circuit enclosure, comprising:
   a chassis;

a fan base integrated with the chassis, the fan base comprising a base connector; and a fan module comprising two module connectors, the fan module disposed to mate a first one of the two module connectors with the base connector in a first configuration to provide a first mode of operation and further disposed to mate a second one of the two module connectors with the base connector in a second configuration to provide a second mode of operation.

5. The enclosure of claim 4, wherein the fan base includes alignment features disposed to facilitate placement of the fan module in the first configuration and in the second configuration.

6. The enclosure of claim 4, wherein the fan base and the fan module are disposed to facilitate change from the first configuration to the second configuration by pulling the fan module apart from the fan base, turning the fan module with respect to the fan base, and then inserting the fan module into the fan base.

* * * * *